(12) United States Patent
Arghavani et al.

(10) Patent No.: US 7,955,510 B2
(45) Date of Patent: Jun. 7, 2011

(54) OXIDE ETCH WITH NH4-NF3 CHEMISTRY

(75) Inventors: Reza Arghavani, Scotts Valley, CA (US); Chien-Teh Kao, Sunnyvale, CA (US); Xinliang Lu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/642,268

(22) Filed: Dec. 18, 2009

(65) Prior Publication Data

US 2010/0093151 A1 Apr. 15, 2010

Related U.S. Application Data

(63) Continuation of application No. 11/622,437, filed on Jan. 11, 2007, now abandoned.

(51) Int. Cl.
*H01L 21/762* (2006.01)
(52) U.S. Cl. .............. 216/38; 216/64; 216/67; 438/424; 257/E21.546
(58) Field of Classification Search ........................ None
See application file for complete search history.

(56) References Cited

U.S. PATENT DOCUMENTS

| | | | |
|---|---|---|---|
| 4,807,016 A | 2/1989 | Douglas | |
| 4,872,947 A | 10/1989 | Wang et al. | |
| 5,030,319 A | 7/1991 | Nishino et al. | |
| 5,282,925 A | 2/1994 | Jeng et al. | |
| 5,320,708 A * | 6/1994 | Kadomura et al. | 438/695 |
| 5,712,185 A * | 1/1998 | Tsai et al. | 438/424 |
| 5,719,085 A * | 2/1998 | Moon et al. | 438/424 |
| 5,766,971 A * | 6/1998 | Ahlgren et al. | 438/296 |
| 5,913,132 A | 6/1999 | Tsai | |
| 6,004,863 A * | 12/1999 | Jang | 438/427 |
| 6,153,523 A * | 11/2000 | Van Ngo et al. | 438/687 |
| 6,191,002 B1 | 2/2001 | Koyanagi | |
| 6,197,116 B1 | 3/2001 | Kosugi | |
| 6,241,845 B1 | 6/2001 | Gadgil et al. | |
| 6,271,147 B1 | 8/2001 | Tseng | |
| 6,399,506 B2 * | 6/2002 | Lin | 438/706 |
| 6,559,026 B1 * | 5/2003 | Rossman et al. | 438/424 |
| 6,635,185 B2 | 10/2003 | Demmin et al. | |
| 6,670,278 B2 | 12/2003 | Li et al. | |
| 6,979,632 B1 * | 12/2005 | Ohtani et al. | 438/487 |

(Continued)

FOREIGN PATENT DOCUMENTS

WO  WO 2004006303  1/2004

(Continued)

OTHER PUBLICATIONS

Examination Report dated Jun. 28, 2010 for European Patent Application No. 05251143.3.

*Primary Examiner* — Allan Olsen
(74) *Attorney, Agent, or Firm* — Patterson & Sheridan, L.L.P.

(57) ABSTRACT

The present invention generally provides apparatus and methods for selectively removing various oxides on a semiconductor substrate. One embodiment of the invention provides a method for selectively removing an oxide on a substrate at a desired removal rate using an etching gas mixture. The etching gas mixture comprises a first gas and a second gas, and a ratio of the first gas and a second gas is determined by the desired removal rate.

20 Claims, 9 Drawing Sheets

U.S. PATENT DOCUMENTS

| | | | | |
|---|---|---|---|---|
| 7,132,134 | B2* | 11/2006 | Rossman | 427/579 |
| 7,294,588 | B2* | 11/2007 | Karim et al. | 438/787 |
| 7,416,989 | B1* | 8/2008 | Liu et al. | 438/706 |
| 7,455,893 | B2* | 11/2008 | Rossman | 427/579 |
| 7,767,024 | B2* | 8/2010 | Kao et al. | 134/1.2 |
| 7,780,793 | B2* | 8/2010 | Yang et al. | 134/1.2 |
| 2004/0005726 | A1 | 1/2004 | Huang | |
| 2004/0072446 | A1* | 4/2004 | Liu et al. | 438/719 |
| 2008/0160210 | A1* | 7/2008 | Yang et al. | 427/534 |
| 2008/0268645 | A1* | 10/2008 | Kao et al. | 438/694 |
| 2010/0107927 | A1* | 5/2010 | Stewart et al. | 106/1.22 |

FOREIGN PATENT DOCUMENTS

WO    WO 2004074932    9/2004

* cited by examiner

OXIDE ETCH WITH NH4-NF3 CHEMISTRY

CROSS-REFERENCE TO RELATED APPLICATIONS

This application is continuation of U.S. patent application Ser. No. 11/622,437, filed Jan. 11, 2007 now abondoned.

This application is also related to U.S. patent application Ser. No. 11/137,609, filed May 24, 2005, now issued as U.S. Pat. No. 7,396,480; U.S. patent application Ser. No. 11/063,645, filed Feb. 22, 2005; U.S. patent application Ser. No. 11/137,199, filed May 24, 2005; U.S. patent application Ser. No. 11/266,167, filed Nov. 3, 2005; U.S. patent application Ser. No. 11/962,791, filed Dec. 21, 2007; and U.S. patent application Ser. No. 12/134,715, filed Jun. 6, 2008.

BACKGROUND OF THE INVENTION

1. Field of the Invention

Embodiments of the present invention generally relate to methods and apparatus for processing semiconductor substrates. More particularly, embodiments of the present invention relates to methods and apparatus for selective oxide etching in semiconductor fabrication.

2. Description of the Related Art

In semiconductor fabrication, oxide fabrication is critical, especially for the thin oxide which is an essential part of gate structure for MOS (Metal Oxide Semiconductor) technology. With proper manufacturing control, oxide layers have high quality, stability and desirable dielectric properties. A variety of oxide fabrication processes are used in integrated device manufactures (IDM) to obtain oxides of different properties for different functions. Thermal oxides and deposited oxides are most used in semiconductor devices. Additionally, native oxides may be generated during process. Different oxides may also respond differently to subsequent processes and may require different treatment for the same purpose.

Thermal oxides are grown thermally by high temperature anneal in an oxygen environment. Thermal oxides may be used as a dielectric material, device isolation, screens for implants, stress-relief (pad-oxides), reoxidizing nitride, and photoresist adhesion and stress reduction for polysilicon surfaces.

Deposited silicon oxides are fabricated by reacting a silicon source and oxygen in a chamber. Oxides can also be deposited by a combination of chemistries such as Ozone/Tetreethylorthosilicate (TEOS) or carbon based chemistries. An exemplary deposited oxide may be HARP (High Aspect Ratio Process) oxide which is produced by a unique process. HARP, also known as sub-atmospheric chemical vapor deposition (SACVD), is a non plasma based chemical vapor deposition (CVD) solution using ozone/TEOS chemistry to deposit an oxide in high aspect ratio gaps, such as shallow trench isolation (STI) and pre-metal dielectric (PMD). Annealing is usually needed to harden HARP oxides.

A native oxide typically forms when a substrate surface is exposed to oxygen. Oxygen exposure occurs when substrates are moved between processing chambers at atmospheric conditions, or when a small amount of oxygen remains in a vacuum chamber. Native oxides may also result from contamination during etching. Native oxides are typically undesirable and need to be removed prior to a subsequent process.

During semiconductor fabrication, structures may be formed with excessive material and then etch and/or polished back to a desired dimension. For oxide features, polishing and etching are generally used after formation to reach desired size. Some oxide features may have two or more oxides that respond differently to the same process, hence posing difficulties in processing, especially when feature sizes are smaller.

STI (Shallow Trench Isolation) is one of the oxide structures that have several forms of oxides. STI is a primary form of device isolation technology used for sub-0.25 micron fabrication. Oxides filled trenches are used to isolate devices formed on a semiconductor substrate. Trenches are first etched on a semiconductor substrate, followed by thermal growth of an oxide layer. The purpose of this high temperature oxide layer is the appropriate corner rounding to avoid early gate dielectric break down and to relieve stress post CVD oxide deposition. The thermal oxide layer also passivates the silicon surface and serves as a barrier layer between silicon and deposited oxide layer. The trench is then filled with High Density Plasma (HDP) or HARP oxide, polished, and etched back. A chemical mechanical polishing (CMP) process may be performed to the oxide filled trench after deposition, followed by an etching process to prepare the trench and other structures on the substrate for the subsequent process, such as various well implants, gate oxidation, and eventually poly deposition and patterning.

Sputter etching processes and wet etching processes are conventionally oxide etching processed used in STI etching. However, sputter etching process generally cannot completely remove oxides and can damage delicate silicon layers by physical bombardment. Wet etching use chemical solutions, for example hydrofluoric acid (HF) and deionized water, to remove oxides. However, diluted HF has the disadvantage of having a variable oxide etch rate. Nitrided oxides etch much slower than non-nitride oxides. Thermal oxides etch at a different rate compared to deposited oxides. Furthermore, annealed oxides have different etch rates than deposited oxides. This causes significant variability and integration issues in the process flow.

In shallow trench isolations for examples, three different oxides are used to fill the trench. Yet to keep the planarity of the oxide post polish and various cleans, an etch chemistry is required that etches all the oxides at the same rate. In reality various process variabilities cause significant unwanted leakages which contribute to the main current flow from source to drain. One example of such an unwanted leakage is the poly silicon wrap around near the STI corners. Traditionally post STI etch/clean a high temperature STI oxide liner that is grown prior to oxide deposition to fill the trench. During various HF etch-backs, the various oxides in the trench etch at different rates. Subsequently, deposited polysilicon intrudes inside the over etched cavities in the oxides. Polysilicon wraps around inside the trench causes unwanted leakage and yield loss.

Therefore, there is a need for apparatus and methods for etching all the oxides at the same rate.

SUMMARY OF THE INVENTION

The present invention generally provides apparatus and methods for selectively removing various oxides on a semiconductor substrate.

One embodiment of the invention provides a method for selectively removing an oxide on a substrate at a desired removal rate comprising positioning the substrate in a vacuum chamber, wherein a surface of the substrate has a structure comprises the oxide, cooling the substrate to a first temperature, generating active species of an etching gas mixture within the vacuum chamber, wherein the etching gas mixture comprises a first gas and a second gas, and a ratio of the first gas and a second gas is determined by the desired removal rate, exposing the structure on the surface of the substrate to the active species to form a film on the structure, heating the substrate to vaporize the film formed on the structure and removing the vaporized film from the vacuum chamber.

Another embodiment of the present invention provides a method for processing a substrate having an oxide structure comprising a first oxide and a second oxide comprising positioning the substrate in a vacuum chamber, cooling the substrate to a first temperature, introducing an etching gas mixture into the vacuum chamber, wherein the etching gas mixture is adjusted to reduce the first oxide at a first rate and the second oxide at a second rate, generating a plasma of the etching gas mixture within the vacuum chamber, exposing the oxide structure to the plasma to form a film on the structure, heating the substrate to vaporize the film formed on the oxide structure, and removing the vaporized film from the vacuum chamber.

Yet another embodiment of the present invention provides a method for processing a substrate comprising positioning the substrate in a vacuum chamber, wherein the substrate having a surface feature comprising a first oxide and a second oxide, introducing an etching gas mixture to the vacuum chamber, generating active species from the etching gas mixture, at least partially reducing the first oxide by exposing the surface feature to the plasma of the etching gas mixture, and reducing the second oxide by an aqueous etch process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention relates to methods and apparatus for selective oxide etching in semiconductor fabrication. More particularly, the present invention provides methods and apparatus for selectively removing and/or uniformly removing one or more oxides from a substrate surface using an etching gas mixture.

Figure 1:
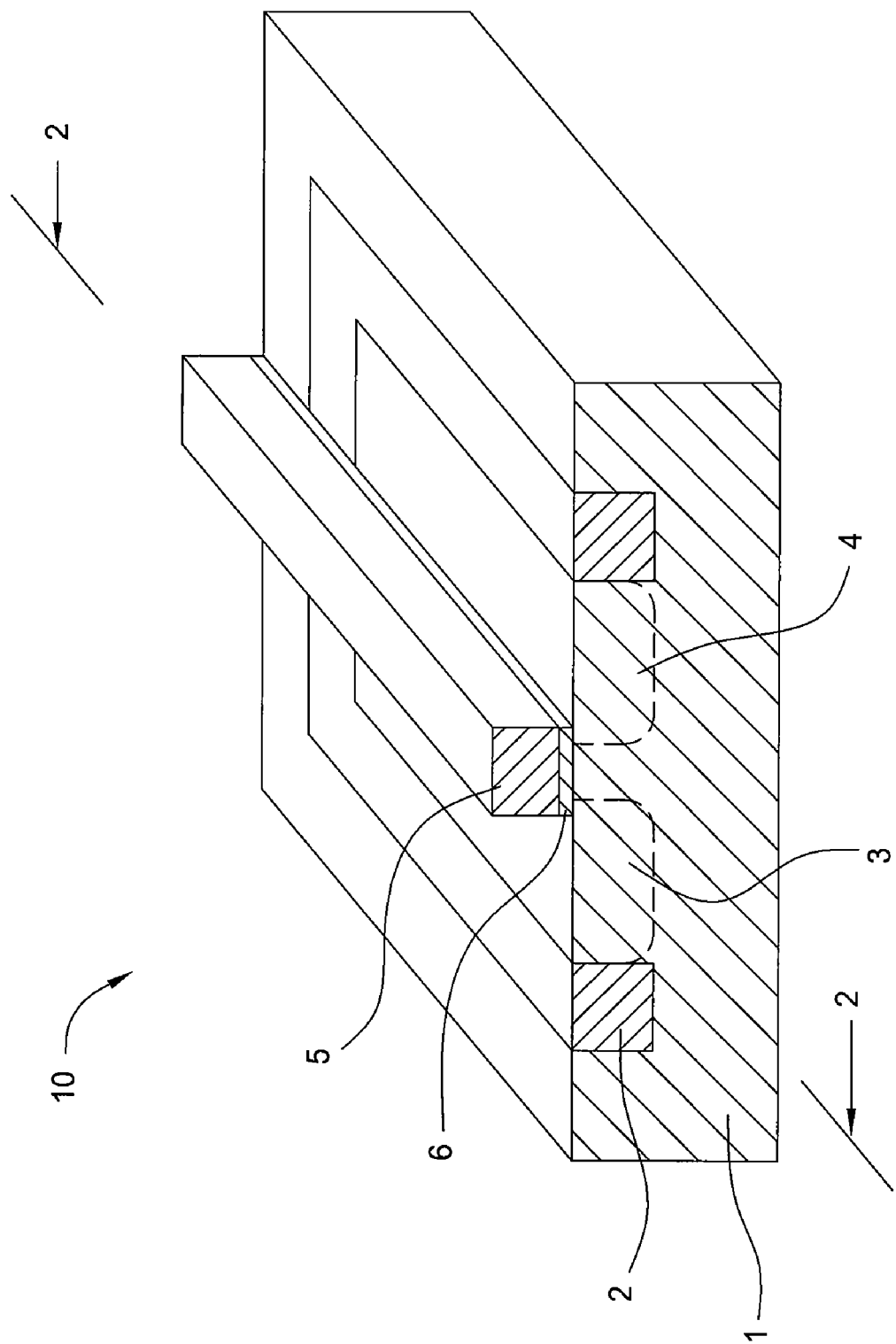
FIG. 1 schematically illustrates a partial perspective view of a substrate block having a shallow trench isolation formed therein.

FIG. 1 schematically illustrates a partial perspective view of a substrate block 10 having a shallow trench isolation formed therein. The substrate block 10 shown is only partially fabricated and has a shallow trench 2 formed in silicon base 1. The shallow trench 2 is filled with oxides and is configured to isolate an electronic device, in this case, a transistor, built within. A source 3 and a drain 4 are formed within the shallow trench 2 from steps of implanting. A polycrystalline silicon structure (usually called poly) 5 is formed between the source 3 and the drain 4. A gate oxide layer 6 is formed between the silicon base 1 and the poly 5. Detailed fabrication sequence is discussed with FIGS. 4 and 5.

Figure 2:
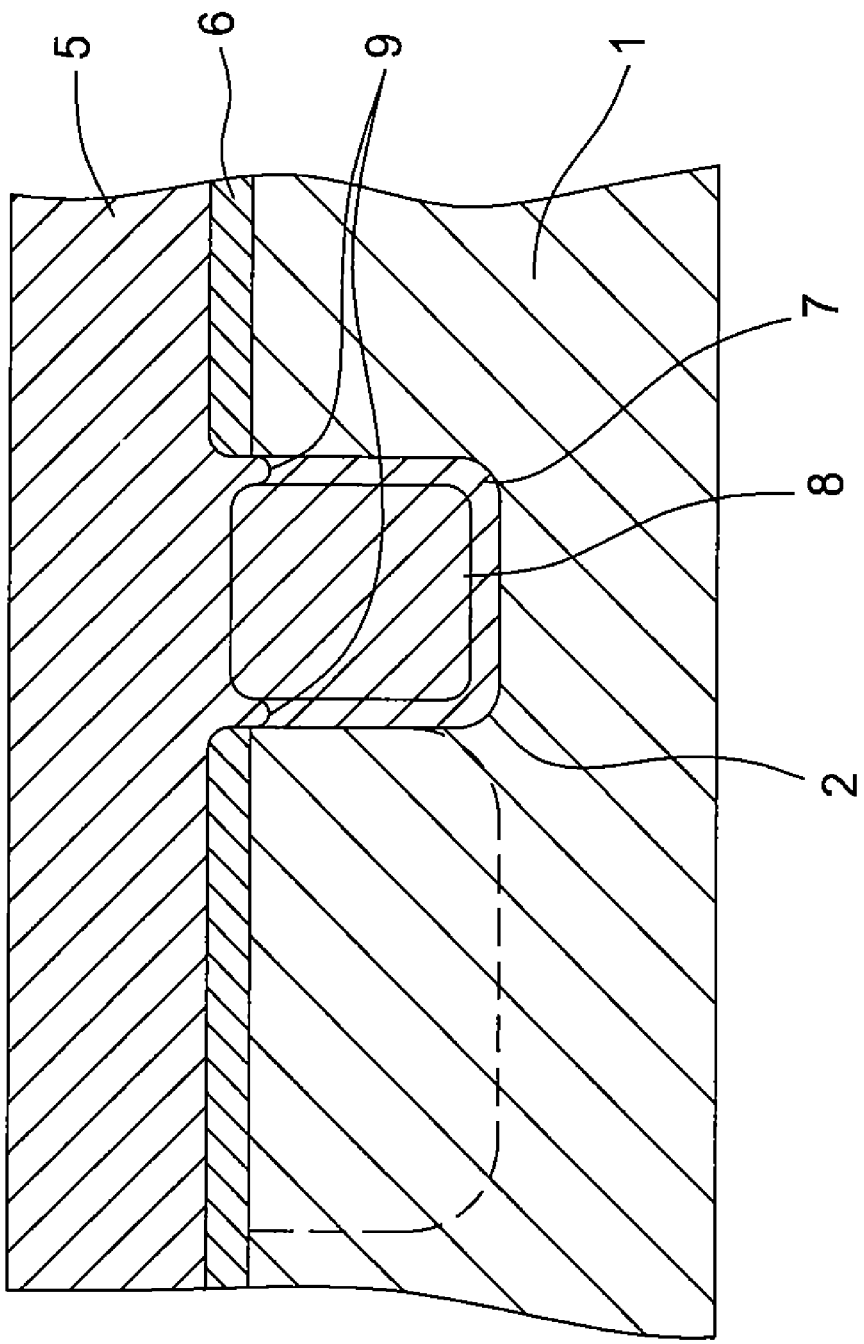
FIG. 2 schematically illustrates a partial view of a shallow trench isolation.

FIG. 2 schematically illustrates a partial sectional view of the substrate block 10 along section line 2-2. FIG. 2 illustrates where the poly 5 meets the shallow trench 2. The shallow trench 2 is formed by a thermal oxide layer 7 and a deposited oxide layer 8. The pre-poly etch/clean step is performed by a state of the art wet etching using HF. Since the HF etches the thermal oxide layer 7 at a faster rate that the deposited oxide layer 8, a gap 9 is formed in the shallow trench 2. The subsequence poly deposition results in the poly 5 filling in the gap 9 and wrapping around the source 3 or drain 4, causing parasitic junctions or leakages.

Figure 3:
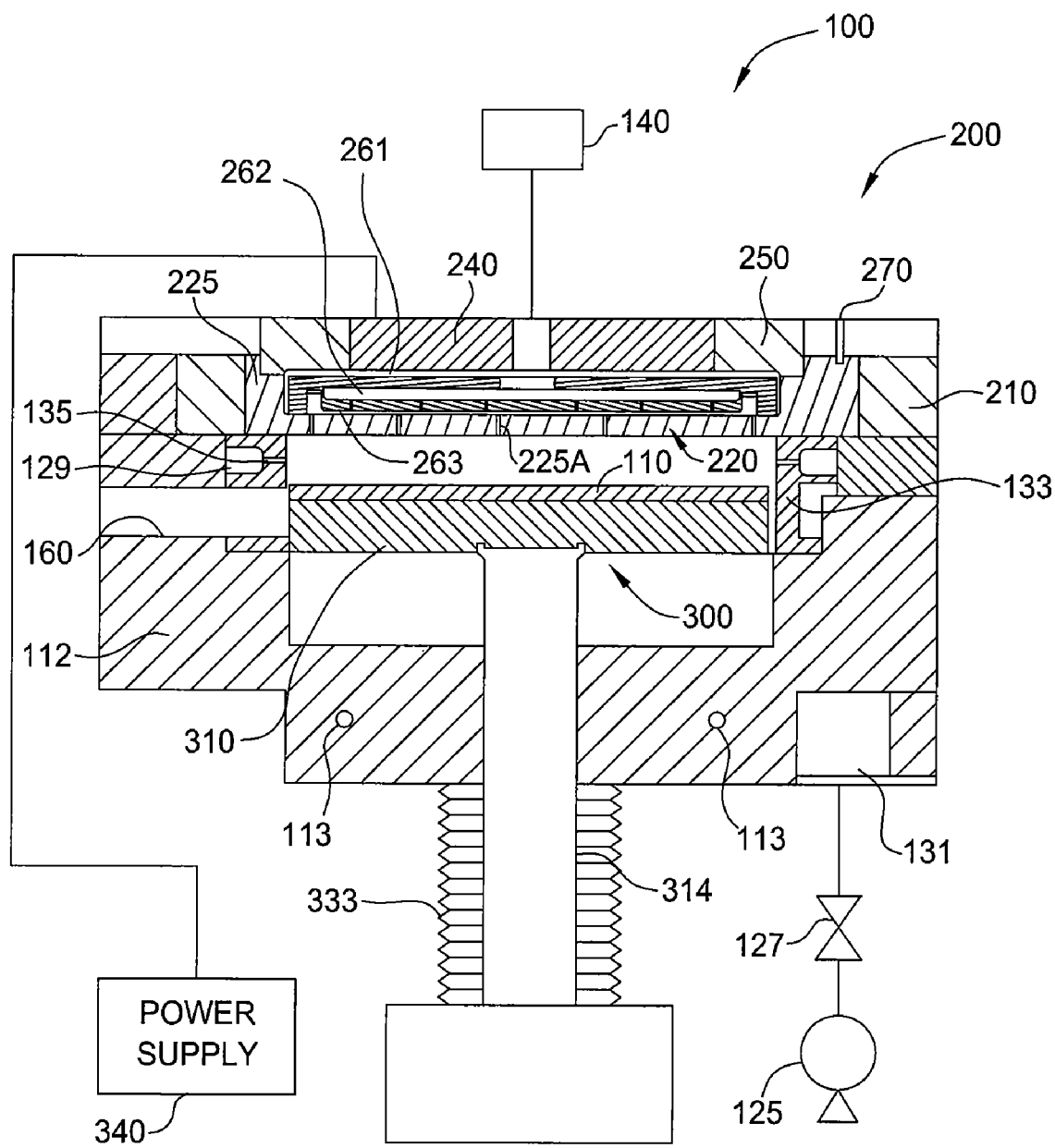
FIG. 3 schematically illustrates a sectional view of a processing chamber in accordance with one embodiment of the present invention.

FIG. 3 schematically illustrates a sectional view of a processing chamber 100 in accordance with one embodiment of the present invention. In this embodiment, the processing chamber 100 includes a lid assembly 200 disposed at an upper end of a chamber body 112, and a support assembly 300 at least partially disposed within the chamber body 112. The processing chamber also includes a remote plasma generator 140 having a remote electrode with a U-shaped cross section. The chamber 100 and the associated hardware are preferably formed from one or more process-compatible materials, for example, aluminum, anodized aluminum, nickel plated aluminum, nickel plated aluminum 6061-T6, stainless steel, as well as combinations and alloys thereof.

The support assembly 300 is partially disposed within the chamber body 112. The support assembly 300 is raised and lowered by a shaft 314 which is enclosed by bellows 333. The chamber body 112 includes a slit valve opening 160 formed in a sidewall thereof to provide access to the interior of the chamber 100. The slit valve opening 160 is selectively opened and closed to allow access to the interior of the chamber body 112 by a wafer handling robot (not shown). Wafer handling robots are well known to those with skill in the art, and any suitable robot may be used. In one embodiment, a wafer can be transported in and out of the process chamber 100 through the slit valve opening 160 to an adjacent transfer chamber and/or load-lock chamber (not shown), or another chamber within a cluster tool. Illustrative cluster tools include but are not limited to the PRODUCER™, CENTURA™, ENDURA™, and ENDURASL™ platforms available from Applied Materials, Inc. of Santa Clara, Calif.

The chamber body 112 also includes a channel 113 formed therein for flowing a heat transfer fluid therethrough. The heat transfer fluid can be a heating fluid or a coolant and is used to control the temperature of the chamber body 112 during processing and substrate transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 further includes a liner 133 that surrounds the support assembly 300, and is removable for servicing and cleaning. The liner 133 is preferably made of a metal such as aluminum, or a ceramic material. However, any process compatible material may be used. The liner 133 may be bead blasted to increase the adhesion of any material deposited thereon, thereby preventing flaking of material which results in contamination of the chamber 100. The liner 133 typically includes one or more apertures 135 and a pumping channel 129 formed therein that is in fluid communication with a vacuum system. The apertures 135 provide a flow path for gases into the pumping channel 129, and the pumping channel provides a flow path through the liner 133 so the gases can exit the chamber 100.

The vacuum system may comprise a vacuum pump 125 and a throttle valve 127 to regulate flow of gases within the chamber 100. The vacuum pump 125 is coupled to a vacuum port 131 disposed on the chamber body 112, and is in fluid communication with the pumping channel 129 formed within the liner 133. The vacuum pump 125 and the chamber body 112 are selectively isolated by the throttle valve 127 to regulate flow of the gases within the chamber 100. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 200 comprises a number of components stacked together. For example, the lid assembly 200 comprises a lid rim 210, gas delivery assembly 220, and a top plate 250. The lid rim 210 is designed to hold the weight of the components making up the lid assembly 200 and is coupled to an upper surface of the chamber body 112 to provide access to the internal chamber components. The gas delivery assembly 220 is coupled to an upper surface of the lid rim 210 and is arranged to make minimum thermal contact therewith. The components of the lid assembly 200 are preferably constructed of a material having a high thermal conductivity and low thermal resistance, such as an aluminum alloy with a highly finished surface, for example. Preferably, the thermal resistance of the components is less than about $5 \times 10^{-4}$ m$^2$ K/W.

The gas delivery assembly 220 may comprise a gas distribution plate 225 or showerhead. A gas supply panel (not shown) is typically used to provide the one or more gases to the chamber 100. The particular gas or gases that are used depend upon the process to be performed within the chamber 100. For example, the typical gases include one or more precursors, reductants, catalysts, carriers, purge, cleaning, or any mixture or combination thereof. Typically, the one or more gases are introduced to the chamber 100 into the lid assembly 200 and then into the chamber body 112 through the gas delivery assembly 220. An electronically operated valve and/or flow control mechanism (not shown) may be used to control the flow of gas from the gas supply into the chamber 100.

In one aspect, the gas is delivered from the gas supply panel to the chamber 100 where the gas line tees into two separate gas lines which feed gases to the chamber body 112 as described above. Depending on the process, any number of gases can be delivered in this manner and can be mixed either in the chamber 100 or before they are delivered to the chamber 100.

Still referring to FIG. 3, the lid assembly 200 may further include an electrode 240 to generate a plasma of reactive species within the lid assembly 200. In this embodiment, the electrode 240 is supported on the top plate 250 and is electrically isolated therefrom. An isolator filler ring (not shown) is disposed about a lower portion of the electrode 240 separating the electrode 240 from the top plate 250. An annular isolator (not shown) is disposed about an upper portion of the isolator filler ring and rests on an upper surface of the top plate 250, as shown in FIG. 3. An annular insulator (not shown) is then disposed about an upper portion of the electrode 240 so that the electrode 240 is electrically isolated from the other components of the lid assembly 200. Each of these rings, the isolator filler and annular isolators can be made from aluminum oxide or any other insulative, process compatible material.

The electrode 240 is coupled to a power source 340 while the gas delivery assembly 220 is connected to ground. Accordingly, a plasma of the one or more process gases is struck in the volume formed between the electrode 240 and the gas delivery assembly 220. The plasma may also be contained within the volumes formed by blocker plates. In the absence of a blocker plate assembly, the plasma is struck and contained between the electrode 240 and the gas delivery assembly 220. In either embodiment, the plasma is well confined or contained within the lid assembly 200.

Any power source capable of activating the gases into reactive species and maintaining the plasma of reactive species may be used. For example, radio frequency (RF), direct current (DC), alternating current (AC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 100. Exemplary remote plasma generators are available from vendors such as MKS Instruments, Inc. and Advanced Energy Industries, Inc. Preferably, an RF power supply is coupled to the electrode 240.

The gas delivery assembly 220 may be heated depending on the process gases and operations to be performed within the chamber 100. In one embodiment, a heating element 270, such as a resistive heater for example, is coupled to the gas delivery assembly 220. In one embodiment, the heating element 270 is a tubular member and is pressed into an upper surface of the gas delivery assembly 220. The upper surface of the gas delivery assembly 220 includes a groove or recessed channel having a width slightly smaller than the outer diameter of the heating element 270, such that the heating element 270 is held within the groove using an interference fit.

The heating element 270 regulates the temperature of the gas delivery assembly 220 since the components of the delivery assembly 220, including the gas delivery assembly 220 and the blocker assembly 230 are each conductively coupled to one another. Additional details of the processing chamber may be found in U.S. patent application Ser. No. 11/063,645, filed Feb. 22, 2005 which is incorporated by reference herein.

The processing chamber 100 is particularly useful for performing a plasma assisted dry etching process that requires heating and cooling of the substrate surface without breaking vacuum. In one embodiment, the processing chamber 100 may be used to selectively remove one or more oxides on the substrate.

For simplicity and ease of description, an exemplary dry etch process for removing one or more silicon oxides using an ammonia ($NH_3$) and nitrogen trifluoride ($NF_3$) gas mixture performed within the processing chamber 100 will now be described. It is believed that the processing chamber 100 is advantageous for any dry etch process that benefits from a plasma treatment in addition to both substrate heating and cooling all within a single processing environment, including an anneal process.

Referring to FIG. 3, the dry etch process begins by placing a substrate 110, such as a semiconductor substrate for example, into the processing chamber 100. The substrate is typically placed into the chamber body 112 through the slit valve opening 160 and disposed on the upper surface of the support member 310. The substrate 110 may be chucked to the upper surface of the support member 310. Preferably, the substrate 110 is chucked to the upper surface of the support member 310 by pulling a vacuum. The support member 310 is then lifted to a processing position within the chamber body 112, if not already in a processing position. The chamber body 112 is preferably maintained at a temperature of between 50° C. and 80° C., more preferably at about 65° C. This temperature of the chamber body 112 is maintained by passing a heat transfer medium through the channel 113.

The substrate 110 is cooled below 65° C., such as between 15° C. and 50° C., by passing a heat transfer medium or coolant through fluid channels formed within the support assembly 300. In one embodiment, the substrate is maintained below room temperature. In another embodiment, the substrate is maintained at a temperature of between 22° C. and 40° C. Typically, the support member 310 is maintained below about 22° C. to reach the desired substrate temperatures specified above. To cool the support member 310, the coolant is passed through the fluid channel formed within the support assembly 300. A continuous flow of coolant is preferred to better control the temperature of the support member 310. The coolant is preferably 50 percent by volume ethylene glycol and 50 percent by volume water. Of course, any ratio of water and ethylene glycol can be used so long as the desired temperature of the substrate is maintained.

An etching gas mixture is introduced to the chamber 100 for selectively removing various oxides on a surface of the substrate 110. In one embodiment, ammonia and nitrogen trifluoride gases are then introduced into the chamber 100 to form the etching gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of the chamber body 112, as well as the capabilities of the vacuum system coupled to the chamber body 112.

The ratio of the etching gas mixture may be predetermined to selectively remove various oxides on the substrate surface. In one embodiment, the ratio of ingredient in the etching gas mixture may be adjusted to uniformly remove various oxides, such as thermal oxides, deposited oxides, and/or native oxides. In one embodiment, molar ratio of ammonia to nitrogen trifluoride in the etching gas mixture may be set to uniformly remove various oxides. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). Preferably, the gases are introduced in the chamber 100 at a molar ratio of from 5:1 (ammonia to nitrogen trifluoride) to 30:1. More preferably, the molar ratio of the gas mixture is of from about 5 to 1 (ammonia to nitrogen trifluoride) to about 10 to 1. The molar ratio of the gas mixture may also fall between about 10:1 (ammonia to nitrogen trifluoride) and about 20:1.

A purge gas or carrier gas may also be added to the etching gas mixture. Any suitable purge/carrier gas may be used, such as argon, helium, hydrogen, nitrogen, or mixtures thereof, for example. Typically, the overall etching gas mixture is from about 0.05% to about 20% by volume of ammonia and nitrogen trifluoride. The remainder being the carrier gas. In one embodiment, the purge or carrier gas is first introduced into the chamber body 112 before the reactive gases to stabilize the pressure within the chamber body 112.

The operating pressure within the chamber body 112 can be variable. Typically, the pressure is maintained between about 500 mTorr and about 30 Torr. Preferably, the pressure is maintained between about 1 Torr and about 10 Torr. More preferably, the operating pressure within the chamber body 112 is maintained between about 3 Torr and about 6 Torr.

An RF power of from about 5 and about 600 Watts is applied to the electrode 240 to ignite a plasma of the gas mixture within the volumes 261, 262, and 263 contained in the gas delivery assembly 220. Preferably, the RF power is less than 100 Watts. More preferable is that the frequency at which the power is applied is very low, such as less than 100 kHz. Preferably, the frequency ranges from about 50 kHz to about 90 kHz.

The plasma energy dissociates the ammonia and nitrogen trifluoride gases into reactive species that combine to form a highly reactive ammonia fluoride ($NH_4F$) compound and/or ammonium hydrogen fluoride ($NH_4F.HF$) in the gas phase. These molecules then flow through the gas delivery assembly 220 via the holes 225A of the gas distribution plate 225 to react with the substrate surface to be processed. In one embodiment, the carrier gas is first introduced into the chamber 100, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F.HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the chamber 100 by the vacuum pump 125. In particular, the volatile gases flow through the apertures 135 formed in the liner 133 into the pumping channel 129 before the gases exit the chamber 100 through the vacuum port 131 into the vacuum pump 125. A thin film of $(NH_4)_2SiF_6$ is left behind on the substrate surface. This reaction mechanism can be summarized as follows:

$$NF_3 + 3NH_3 \rightarrow NH_4F + NH_4F.HF + N_2$$

$$6NH_4F + SiO_2 \rightarrow (NH_4)_2SiF_6 + 2H_2O + 4 NH_3$$

$$(NH_4)_2SiF_6 + heat \rightarrow 2NH_3 + 2HF + SiF_4$$

After the thin film is formed on the substrate surface, the support member 310 may be elevated to an anneal position in close proximity to the heated gas distribution plate 225. The heat radiated from the gas distribution plate 225 may dissociate or sublimate the thin film of $(NH_4)_2SiF_6$ into volatile $SiF_4$, $NH_3$, and HF products. These volatile products are then removed from the chamber 100 by the vacuum pump 125 as described above. Typically, a temperature of 75° C. or more is used to effectively sublimate and remove the thin film from the substrate 110. Preferably, a temperature of 100° C. or more is used, such as between about 115° C. and about 200° C.

The thermal energy to dissociate the thin film of $(NH_4)_2SiF_6$ into its volatile components is convected or radiated by the gas distribution plate 225. As described above, the heating element 270 is directly coupled to the distribution plate 225, and is activated to heat the distribution plate 225 and the components in thermal contact therewith to a temperature between about 75° C. and 250° C. In one aspect, the distribution plate 225 is heated to a temperature of between 100° C. and 150° C., such as about 120° C.

This elevation change can be effectuated various ways. For example, the lift mechanism 330 can elevate the support member 310 toward a lower surface of the distribution plate 225. During this lifting step, the substrate 110 is secured to the support member 310, such as by the vacuum chuck or electrostatic chuck described above. Alternatively, the substrate 110 can be lifted off the support member 310 and placed in close proximity to the heated distribution plate 225 by elevating the lift pins 325 via the lift ring 320.

The distance between the upper surface of the substrate 110 having the thin film thereon and the distribution plate 225 is not critical and is a matter of routine experimentation. A person of ordinary skill in the art can easily determine the spacing required to efficiently and effectively vaporize the thin film without damaging the underlying substrate. It is believed, however, that a spacing of between about 0.254 mm (10 mils) and 5.08 mm (200 mils) is effective.

Once the film has been removed from the substrate, the processing chamber 100 is purged and evacuated. The processed substrate is then removed from the chamber body 112 by lowering the substrate support 300 to the transfer position, de-chucking the substrate, and transferring the substrate through the slit valve opening 160.

One embodiment of the present invention may be applied to uniformly remove various oxides during fabrication of a shallow trench isolation. STI is a primary form of device isolation technology used for sub-0.25 micron fabrication. STI fabrication generally includes trench mask and etch, sidewall oxidation, trench fill and planarization. FIGS. 4A-4I are sectional schematic views of a fabrication sequence for forming a shallow trench isolation in accordance with one embodiment of the present invention.

Figure 4A:
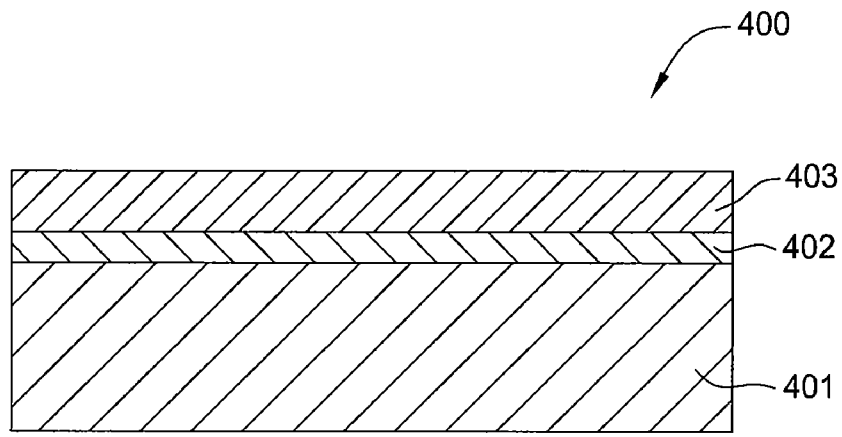
FIGS. 4A-4I are sectional schematic views of a fabrication sequence for forming a shallow trench isolation in accordance with one embodiment of the present invention.

FIG. 4A illustrates a semiconductor substrate 401 after a barrier oxide layer 402 and a deposited nitride layer 403. The substrate 401 may be a silicon substrate having a <100> crystallographic orientation and a diameter of 150 mm (6 inches), 200 mm (8 inches), or 300 mm (12 inches). The barrier oxide layer 402 may be grown on the substrate 401 in a high temperature oxidation furnace. The barrier layer 402 may have a thickness of about 150 Å. The barrier oxide layer 402 protects the substrate 401 from contamination during later nitride strip step. The nitride layer 403 may be formed in a high temperature low pressure chemical vapor deposition (LPCVD) furnace. The nitride layer 403 is generally a thin layer of silicon nitride (Si3N4) formed from the reaction of ammonia and dichlorosilane gases. The nitride layer 403 is a durable masking material which protects the substrate 401 during oxide deposition and serves as a polishing stop material during a later chemical mechanical planarization (CMP).

Figure 4B:
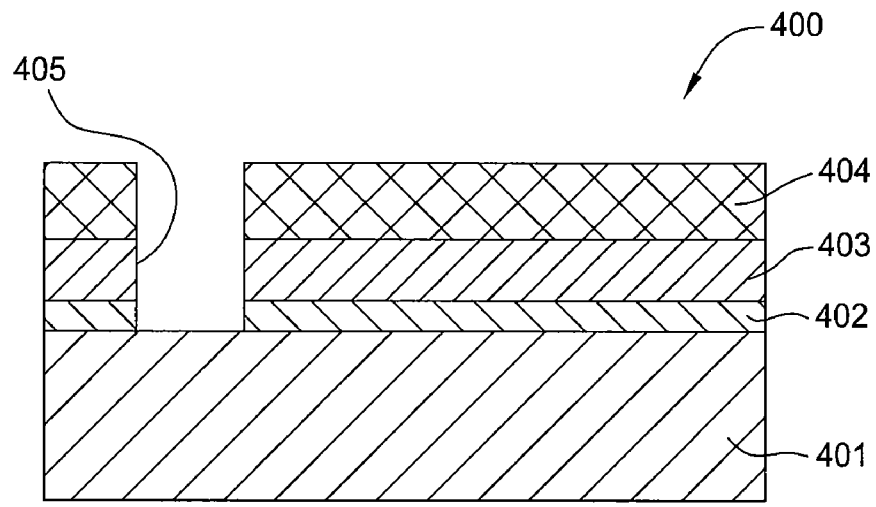

FIG. 4B illustrates a photo resist layer 404 being formed, exposed and developed over the nitride layer 403. A trench pattern may be formed on the photo resist layer 404. Subsequent nitride etching and oxide etching steps forming a trench pattern 405 in the nitride layer 403 and the barrier layer 402 exposing locations designated as isolation regions in substrate 401.

Figure 4C:
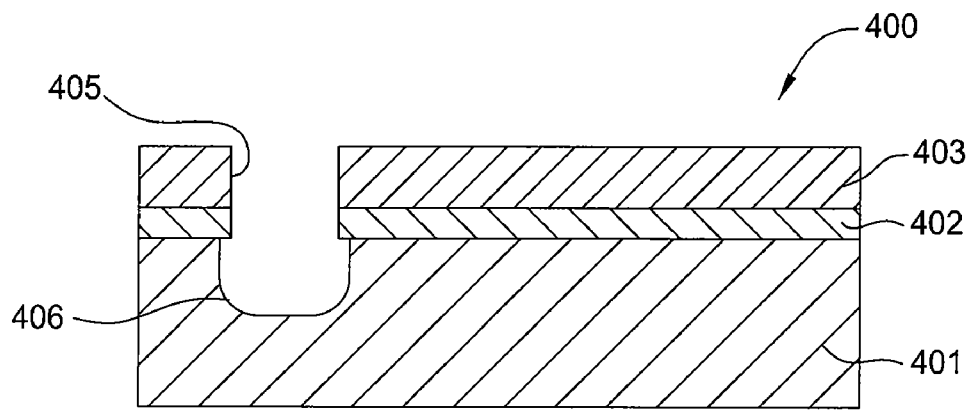

FIG. 4C illustrates a shallow trench 406 is formed within the substrate 401 using an etching process, such as a dry plasma etching. The shallow trench 406 will later be filled with dielectric materials and serves as insolating materials between electronic devices, such as metal on substrate field effect transistors (MOSFET), built on substrate 401.

Figure 4D:
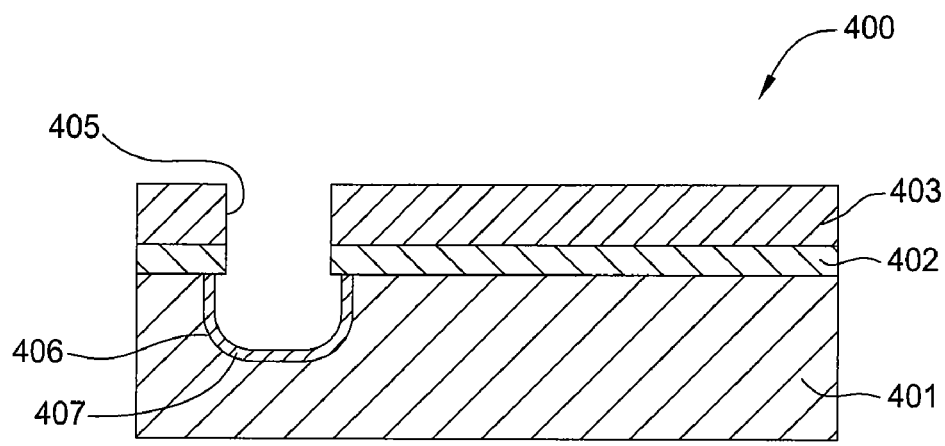

FIG. 4D illustrates a liner oxide layer 407 formed inside the shallow trench 406. The liner oxide layer 407 is typically grown thermally in a high temperature oxidation furnace. The purpose of the liner oxide layer 407 is to improve the interface between the substrate 401 and trench oxide to be filled in.

Figure 4E:
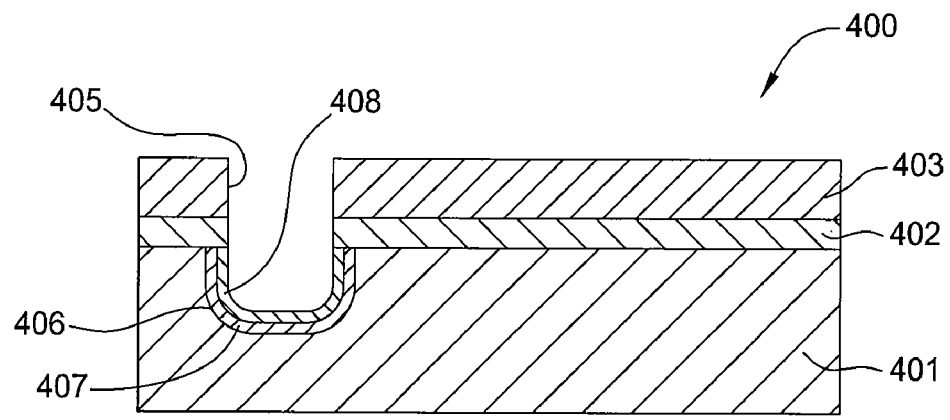

FIG. 4E illustrates a nitride liner 408 formed above the liner oxide layer 407 inside the shallow trench 406. The nitride liner 408 may be formed by a plasma enhanced chemical vapor deposition (PECVD) process from silane and ammonia in a carrier gas such as nitrogen or argon. The purpose of the nitride liner 408 is to induce stress in the shallow trench 406 and prevent mechanical failures caused by stressed oxides.

Figure 4F:
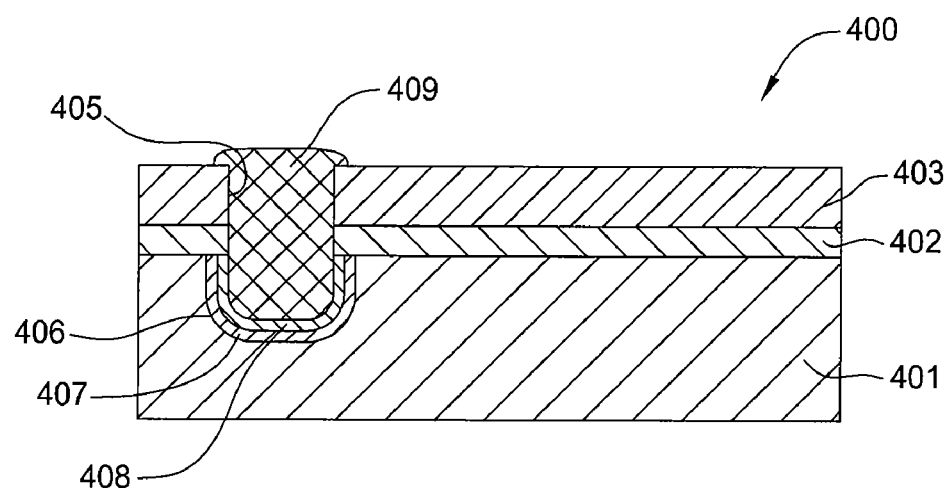

FIG. 4F illustrates trench oxide 409 filled inside the shallow trench 406 and the trench pattern 405. The trench oxide 409 is typically formed by a CVD process with a relatively high deposition rate. The trench oxide 409 is overfilled so that the trench oxide 409 is above a top surface of the substrate 401.

Figure 4G:
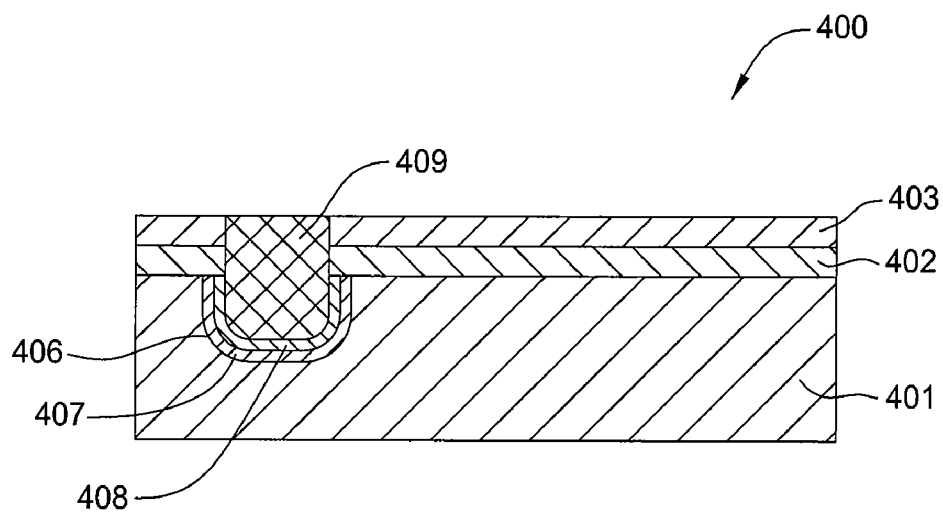

A CMP process may be applied to obtain a planar surface as shown in FIG. 4G. The CMP process removes the excess oxide from the trench oxide 409.

Figure 4H:
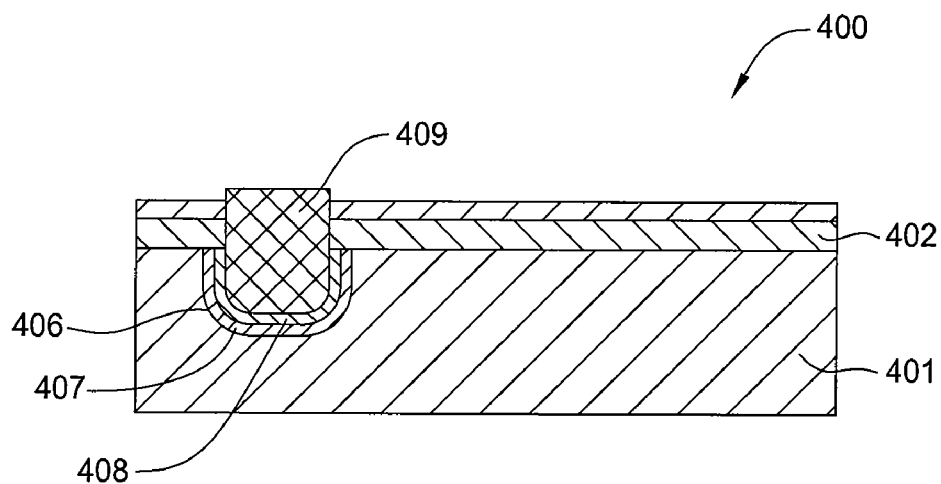

A nitride strip step may be performed to remove the nitride layer 402 and expose various oxides, thermal oxide from the barrier layer 402, deposited oxide from the trench oxide 409, thermal oxide from the liner oxide layer 407, and nitrided oxide from the nitride liner 408, as shown in FIG. 4H.

Figure 4I:
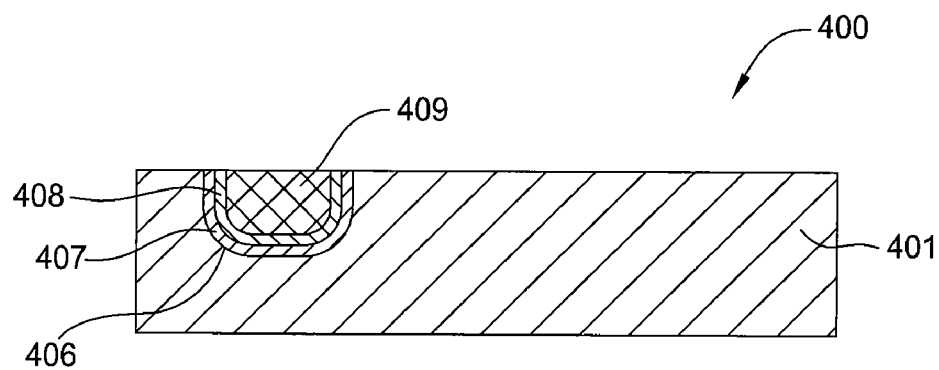

Typically, an oxide etching step will be performed to get the shallow trench structure ready for the subsequence processing step, for example, various well implants. FIG. 4I illustrates the STI after the dry etching process. A dry etching process of the present invention may be used to etch the various oxides exposed in FIG. 4H to obtain a substantially planar top surface over the shallow trench 409 and prevent undesired junction and leakages. In one embodiment, the dry etch process may be preformed in a processing chamber similar to the processing chamber 100 of the present invention. The substrate 400 may be positioned in a vacuumed processing chamber and maintained at a temperature of between 50° C. and 80° C., more preferably at about 65° C. The substrate is then cooled below 65° C., such as between 15° C. and 50° C. An etching gas mixture is introduced to the processing chamber 100 for removing the various oxides on a surface of the substrate 400. In one embodiment, an etching gas mixture comprising ammonia and nitrogen trifluoride gases is introduced into the processing chamber. The amount and ratio of ammonia and nitrogen trifluoride are adjusted to accommodate, for example, the thickness of the oxide layers to be removed, the geometry of the substrate 400, the volume capacity of the plasma, the volume capacity of the chamber, the capabilities of the vacuum system, as well as the properties of different oxides on the substrate 400. A purge gas or carrier gas may also be added to the etching gas mixture. A plasma of the etching gas mixture is then ignited. The plasma reacts with the oxides leaving a layer of thin film on the substrate 400. The substrate 400 is then heated to a temperature of above 75° C., particularly a temperature between about 115° C. and about 200° C., to sublimate the thin film. The processing chamber can then be purged and evacuated. The substrate 400 is then ready for subsequence steps.

The etch process described above may be used in various etching steps during semiconductor fabrication, especially in the steps where one or more oxides is to be at least partially removed. For example, various etch backs before implants and deposition may employ the etch process described above.

FIGS. 5A-5H are sectional schematic views of a fabrication sequence for forming an electronic device, such as a MOSFET structure 500, including the dry etch process and the processing chamber 100 described herein.

Referring to FIGS. 5A-5H, the exemplary MOSFET structure may be formed on a semiconductor material, for example a silicon or gallium arsenide substrate 525. Preferably, the substrate 525 is a silicon wafer having a <100> crystallographic orientation and a diameter of 150 mm (6 inches), 200 mm (8 inches), or 300 mm (12 inches). Typically, the MOSFET structure includes a combination of (i) dielectric layers, such as silicon dioxide, organosilicate, carbon doped silicon oxide, phosphosilicate glass (PSG), borophosphosilicate glass (BPSG), silicon nitride, or combinations thereof; (ii) semiconducting layers such as doped polysilicon, and n-type or p-type doped monocrystalline silicon; and (iii) electrical contacts and interconnect lines formed from layers of metal or metal silicide, such as tungsten, tungsten silicide, titanium, titanium silicide, cobalt silicide, nickel silicide, or combinations thereof.

Figure 5A:
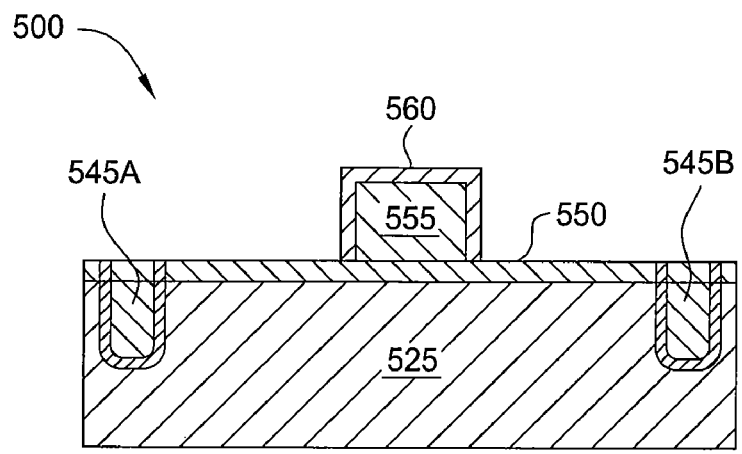
FIGS. 5A-5H are sectional schematic views of a fabrication sequence for forming an electronic device isolated in a STI.

Referring to FIG. 5A, fabrication of the active electronic device begins by forming electrical isolation structures that electrically isolate the active electronic device from other devices. There are several types of electrical isolation structures, such as field oxide barrier, or shallow trench isolation. In this case, a shallow trench isolation 545A and 545B which surround exposed regions in which the electrically active elements of the device are formed and prepared. The STI may include two or more oxides as described in FIGS. 4A-I. The exposed regions are thermally oxidized to form a thin gate oxide layer 550 having a thickness of from about 50 to 300 angstroms. A polysilicon layer is then deposited, patterned, and etched to create a gate electrode 555. The surface of the polysilicon gate electrode 555 can be reoxidized to form an insulating dielectric layer 560, providing the structure shown in FIG. 5A.

Figure 5B:
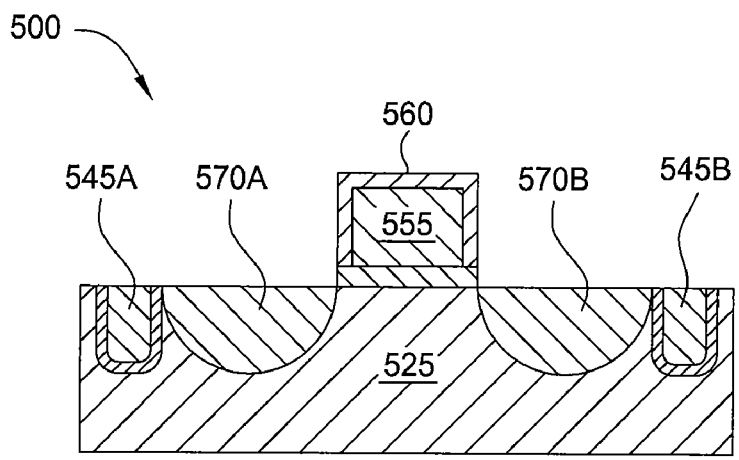

Referring to FIG. 5B, a source 570A and a drain 570B are next formed by doping the appropriate regions with suitable dopant atoms. For example, on p-type substrates 525, an n-type dopant species comprising arsenic or phosphorous is used. Typically the doping is performed by an ion implanter and might include, for example, phosphorous ($^{31}$P) at a concentration of about $10^{13}$ atoms/cm$^2$ at an energy level of from about 30 to 80 Key, or Arsenic ($^{75}$As) at a dose of from about $10^{15}$ to $10^{17}$ atoms/cm$^2$ and an energy of from 10 to 100 Kev. After the implantation process, the dopant is driven into the substrate 525 by heating the substrate, for example, in a rapid thermal processing (RTP) apparatus. Thereafter, the thin gate oxide layer 550 covering regions of the source 570A and drain 570B is stripped by a dry etching process described above to remove any impurities caused by the implantation process which are trapped in the thin gate oxide layer 550. The two or more oxides in the shallow trench isolation 545A and 545B may be also be etched. The etching gas mixture may be adjusted to accommodate various etch rates needed for different oxides.

Figure 5C:
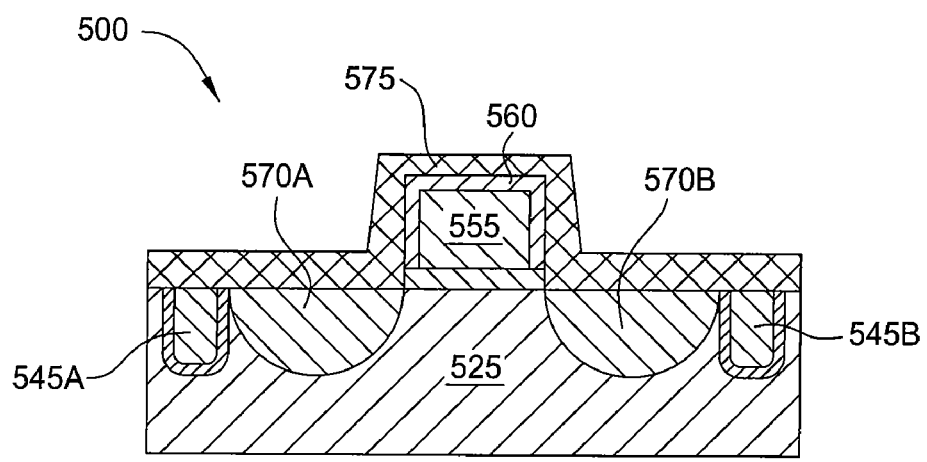
Figure 5D:
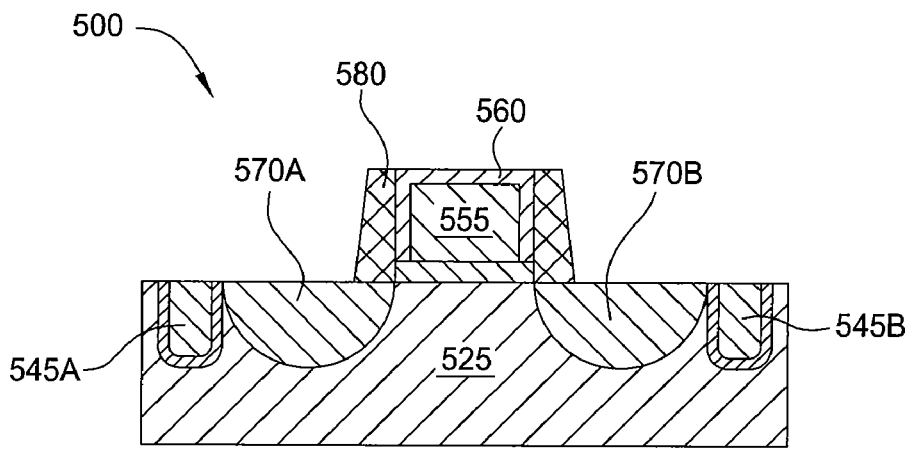

Referring to FIGS. 5C and 5D, a silicon nitride layer 575 is deposited on the gate electrode 555 and the surfaces on the substrate 525 by low-pressure chemical vapor deposition (LPCVD) using a gas mixture of SiH$_2$, Cl$_2$, and NH$_3$. The silicon nitride layer 575 is then etched using reactive ion etching (RIE) techniques to form nitride spacers 580 on the sidewall of the gate electrode 555, as shown in FIG. 5D. The spacers 580 electrically isolate a silicide layer formed on the top surface of the gate electrode 555 later from other silicide layers deposited over the source 570A and the drain 570B. It should be noted that the electrical isolation sidewall spacers 580 can be fabricated from other materials, such as silicon oxide. The silicon oxide layers used to form sidewall spacers 580 are typically deposited by CVD or PECVD from a feed gas of tetraethoxysilane (TEOS) at a temperature in the range of from about 600° C. to about 1,000° C. Although, the spacers 580 are shown to be formed after implantation and RTP activation, the spacers 580 may be formed prior to source/drain implantation and RTP activation.

Figure 5E:
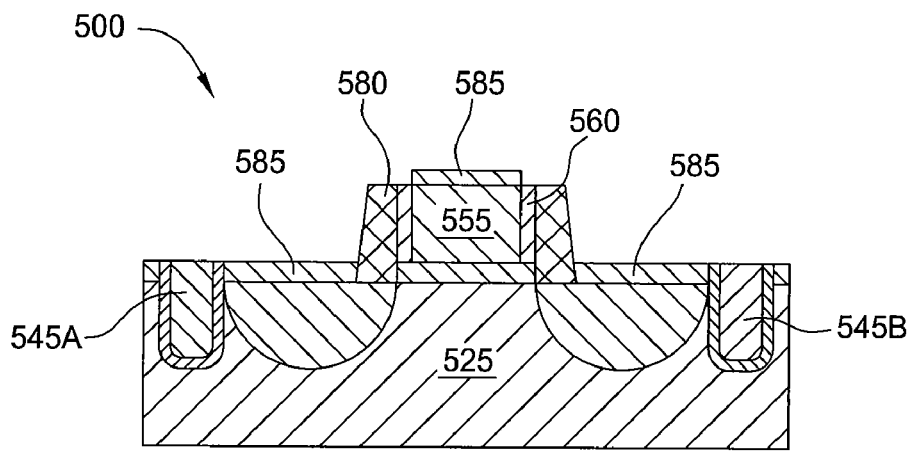
Figure 5F:
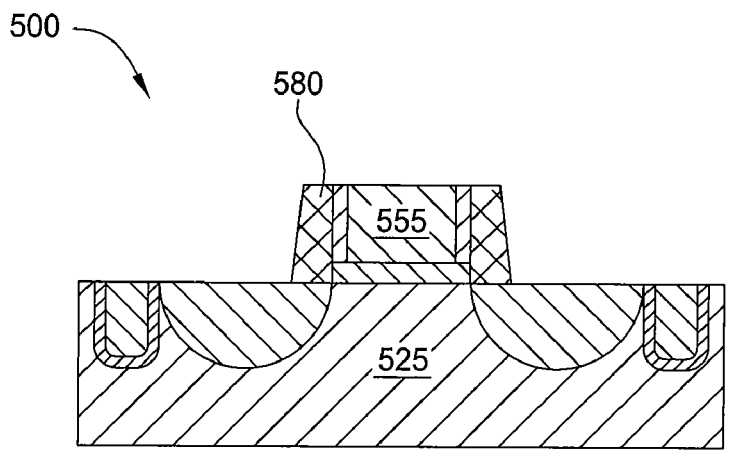

Referring to FIG. 5E, a native silicon oxide layer 585 is typically formed on exposed silicon surfaces by exposure to the atmosphere before and after the processes. The native silicon oxide layer 585 must be removed prior to forming conductive metal silicide contacts on the gate electrode 555, the source 570A, and the drain 570B to improve the alloying reaction and electrical conductivity of the metal suicide formed. The native silicon oxide layer 585 can increase the electrical resistance of the semiconducting material, and adversely affect the silicidation reaction of the silicon and metal layers that are subsequently deposited. Therefore, it is necessary to remove this native silicon dioxide layer 585 using the dry etch process described prior to forming metal silicide contacts or conductors for interconnecting active electronic devices. The dry etching process described above may be used to remove the native silicon oxide layers 585 to expose the source 570A, the drain 570B, and the top surface of the gate electrode 555 as shown in FIG. 5F. The oxides in the shallow trench isolation 545A and 545B are also exposed to the dray etching process. Proper adjustment, such as ratio of reactive gases, may be applied to the dry etching process to obtain a uniform removal rate at different surfaces.

Figure 5G:
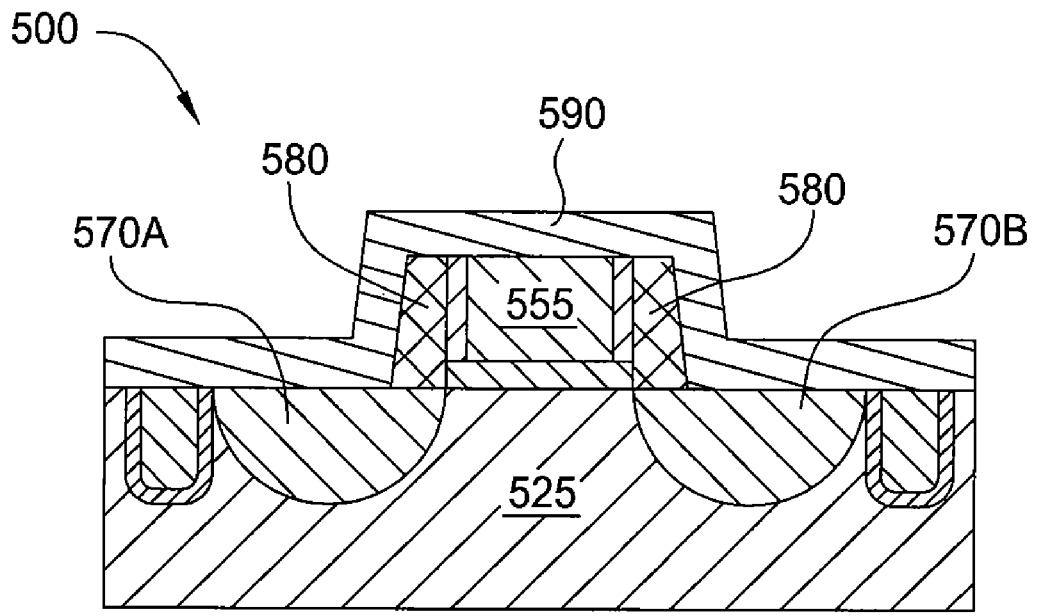

Thereafter, as illustrated in FIG. 5G, a physical vapor deposition (PVD) or sputtering process is used to deposit a layer of metal 590. Conventional furnace annealing is then used to anneal the metal and silicon layers to form metal silicide in regions in which the metal layer 590 is in contact with silicon. The anneal is typically performed in a separate processing system. Accordingly, a protective cap layer (not shown) may be deposited over the metal 590. The cap layers are typically nitride materials and may include one or more materials selected from the group consisting of titanium nitride, tungsten nitride, tantalum nitride, hafnium nitride, and silicon nitride. The cap layer may be deposited by any deposition process, preferably by PVD.

Annealing typically involves heating the MOSFET structure 500 to a temperature of between 600° C. and 800° C. in an atmosphere of nitrogen for about 30 minutes. Alternatively, the metal silicide 595 can be formed utilizing a rapid thermal annealing process in which the MOSFET structure 500 is rapidly heated to about 1000° C. for about 30 seconds. Suitable conductive metals include cobalt, titanium, nickel, tungsten, platinum, and any other metal that has a low contact resistance and that can form a reliable metal silicide contact on both polysilicon and monocrystalline silicon.

Figure 5H:
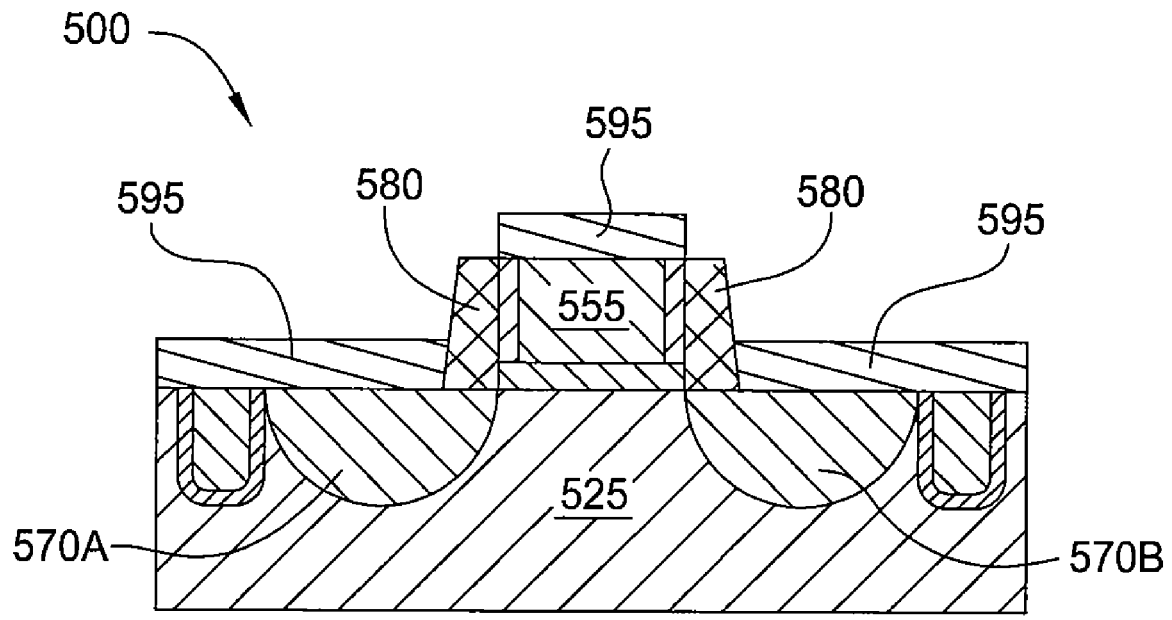

Unreacted portions of the metal layer 590 can be removed by a wet etch using aqua regia, (HCl and HNO$_3$) which removes the metal without attacking the metal silicide 595; the spacer 580, or the field oxide 545A,B, thus leaving a self-aligned metal silicide 595 on the gate electrode 555, source 570A, and drain 570B, as shown in FIG. 5H. Thereafter, an insulating cover layer comprising, for example, silicon oxide, BPSG, or PSG, can be deposited on the electrode structures. The insulating cover layer is deposited by means of chemical-vapor deposition in a CVD chamber, in which the material condenses from a feed gas at low or atmospheric pressure, as for example, described in commonly assigned U.S. Pat. No. 5,500,249, issued Mar. 19, 1996, which is incorporated herein by reference. Thereafter, the MOSFET structure 500 is annealed at glass transition temperatures to form a smooth planarized surface.

Although the process sequence above has been described in relation to the formation of a MOSFET device, the dry etching process described herein can also be used to form other semiconductor structures and devices that require removal of various oxides. The dry etching process can also be used prior to the deposition of layers of different metals including, for example, aluminum, copper, cobalt, nickel, silicon, titanium, palladium, hafnium, boron, tungsten, tantalum, or mixtures thereof.

In one embodiment, the dry etching process of the present invention may be combined with an aqueous etching process. For example, for an oxide structure having at least two oxides, a dry etching process may be used to selectively remove a first oxide, either completely or partially reduce the first oxide feature relative to a second oxide. An aqueous HF etching process may be followed to remove the second oxide.

To provide a better understanding of the foregoing discussion, the following non-limiting example is offered. Although the example may be directed to specific embodiments, the example should not be interpreted as limiting the invention in any specific respect.

EXAMPLE

During etching, a gas mixture of 2 sccm of $NF_3$, 10 sccm of $NH_3$ and 2,500 sccm of argon was introduced into a vacuum chamber, such as the processing chamber 100. A plasma of the gas mixture was ignited using 100 Watts of power. The bottom purge was 1,500 sccm of argon and the edge purge was 50 sccm of argon. The chamber pressure was maintained at about 6 Torr, and the substrate temperature was about 22° C. The substrate was etched for 120 seconds.

During anneal, the spacing was 750 mil and the lid temperature was 120° C. The substrate was annealed for about 60 seconds. About 50 angstroms of material was removed from the substrate surface. No anneal effect was observed. The etch rate was about 0.46 angstroms per second (28 Å/min). The observed etch uniformity was about 5% for the 50 Å etch.

Unless otherwise indicated, all numbers expressing quantities of ingredients, properties, reaction conditions, and so forth, used in the specification and claims are to be understood as approximations. These approximations are based on the desired properties sought to be obtained by the present invention, and the error of measurement, and should at least be construed in light of the number of reported significant digits and by applying ordinary rounding techniques. Further, any of the quantities expressed herein, including temperature, pressure, spacing, molar ratios, flow rates, and so on, can be further optimized to achieve the desired etch selectivity and particle performance.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
 positioning the substrate in a vacuum chamber, wherein a surface of the substrate has a first oxide layer formed thereon;
 etching a feature definition in the first oxide layer and the substrate surface;
 depositing a second oxide in the feature definition in an amount above the substrate surface;
 generating active species of a processing gas mixture comprising a first gas and a second gas at a molar ratio of the first gas to the second gas from 3:1 to 30:1;
 converting at least a portion of the first oxide and at least a portion of the second oxide to a film on the surface of the substrate; and
 sublimating the film formed on the structure to substantially planarize the surface of the substrate.

2. The method of claim 1, wherein depositing the second oxide further comprises depositing a liner oxide in the feature definition and a nitride liner on the liner oxide before depositing the second oxide.

3. The method of claim 1, further comprising cooling the substrate to a first temperature from 15° C. to 65° C. prior to generating active species.

4. The method of claim 1, wherein the active species comprise nitrogen and fluorine atoms.

5. The method of claim 4, wherein the first gas is ammonia ($NH_4$) and the second gas is nitrogen trifluoride ($NF_3$).

6. The method of claim 5, wherein the processing gas comprises a molar ratio of ammonia ($NH_4$) to nitrogen trifluoride ($NF_3$) at 5:1.

7. The method of claim 1, wherein the processing gas comprises a molar ratio of the first gas to the second gas from 3:1 to 10:1.

8. The method of claim 1, wherein the processing gas mixture further comprises a carrier gas.

9. The method of claim 1, further comprising introducing a carrier gas to the vacuum chamber prior to generating the active species.

10. The method of claim 1, wherein the film is a salt comprising nitrogen and fluorine atoms.

11. The method of claim 10, wherein the film comprises ammonium hexafluorosilicate.

12. The method of claim 1, wherein sublimating the film comprises heating the substrate to a second temperature from 75° C. to 200° C.

13. The method of claim 12, further comprising removing the sublimated film material from the vacuum chamber.

14. A method for processing a substrate, comprising:
 positioning the substrate in a vacuum chamber, wherein the substrate comprises a first oxide layer formed on the surface of the substrate, a feature definition formed in the first oxide layer and the substrate surface, and a second oxide formed in the feature definition in an amount above the substrate surface;
 selectively removing the first oxide and the second oxide from the substrate surface by a process comprising:
  introducing a processing gas comprising a first gas and a second gas at a molar ratio of the first gas to the second gas from 3:1 to 30:1 to the vacuum chamber;
  generating a plasma of the processing gas;
  exposing the first oxide layer and the second oxide layer to the plasma of the processing gas;
  forming a nitrogen and fluorine containing film with at least a portion of the first oxide layer and at least a portion of the second oxide layer; and
  sublimating the nitrogen and fluorine containing film from the substrate surface.

15. The method of claim 14, wherein a liner oxide is formed in the feature definition and a nitride liner is formed on the liner oxide before forming the second oxide in the feature definition.

16. The method of claim 15, further comprising forming the nitrogen and fluorine containing film with exposed portions of the liner oxide layer and substantially planarizing the liner oxide with the surface of the substrate.

17. The method of claim 14, wherein the processing gas comprises a molar ratio of ammonia ($NH_4$) to nitrogen trifluoride ($NF_3$) from 3:1 to 10:1 and the nitrogen and fluorine containing film comprises ammonium hexafluorosilicate.

18. The method of claim 17, wherein the nitrogen and fluorine containing film comprises ammonium hexafluorosilicate.

19. The method of claim 14, wherein the processing gas mixture further comprises a carrier gas.

20. The method of claim 14, wherein sublimating the nitrogen and fluorine containing film from the substrate surface comprises heating the substrate to a second temperature from 75° C. to 200° C.

* * * * *

UNITED STATES PATENT AND TRADEMARK OFFICE
CERTIFICATE OF CORRECTION

PATENT NO. : 7,955,510 B2
APPLICATION NO. : 12/642268
DATED : June 7, 2011
INVENTOR(S) : Arghavani et al.

It is certified that error appears in the above-identified patent and that said Letters Patent is hereby corrected as shown below:

In the Detailed Description

Column 8, Line 34, please delete "$NF_3+3NH_3 \rightarrow NH_4F+NH_4F.HF+N_2$" and insert
--$NF_3+3NH_3 \rightarrow NH_4F+NH_4F \cdot HF+N_2$-- therefor;

Column 11, Line 31, please delete "Key" and insert --Kev-- therefor.

Signed and Sealed this
Twenty-third Day of August, 2011

David J. Kappos
*Director of the United States Patent and Trademark Office*